(12) United States Patent
Yang et al.

(10) Patent No.: US 8,745,545 B2
(45) Date of Patent: Jun. 3, 2014

(54) SYSTEMS AND METHODS FOR STOCHASTIC MODELS OF MASK PROCESS VARIABILITY

(71) Applicant: Micron Technology, Inc., Boise, ID (US)

(72) Inventors: Ming-Chuan Yang, Meridian, ID (US); Jung H. Woo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/037,049

(22) Filed: Sep. 25, 2013

(65) Prior Publication Data

US 2014/0026106 A1    Jan. 23, 2014

Related U.S. Application Data

(62) Division of application No. 13/098,150, filed on Apr. 29, 2011, now Pat. No. 8,555,210.

(51) Int. Cl.
*G06F 17/50* (2006.01)

(52) U.S. Cl.
USPC ............... 716/50; 716/51; 716/52; 716/53; 716/54; 716/56

(58) Field of Classification Search
CPC ............. G06F 1/36; G06F 7/70; G06F 7/705; G06F 7/2063; G06F 7/70441; G06F 2217/10
USPC ............................... 716/50–56, 106
See application file for complete search history.

(56) References Cited

U.S. PATENT DOCUMENTS

| | | | |
|---|---|---|---|
| 7,318,214 B1 | 1/2008 | Prasad et al. | |
| 7,649,779 B2 | 1/2010 | Ruttkowski et al. | |
| 7,861,195 B2 | 12/2010 | Chan et al. | |
| 2005/0064618 A1* | 3/2005 | Brown et al. | 438/49 |
| 2005/0240895 A1 | 10/2005 | Smith et al. | |
| 2006/0183025 A1 | 8/2006 | Yang et al. | |
| 2009/0031268 A1 | 1/2009 | Miranda et al. | |
| 2009/0144691 A1* | 6/2009 | Rathsack et al. | 716/19 |
| 2010/0324878 A1 | 12/2010 | Lee et al. | |

* cited by examiner

*Primary Examiner* — Paul Dinh
(74) *Attorney, Agent, or Firm* — Fletcher Yoder, P.C.

(57) ABSTRACT

Systems and methods are disclosed for a stochastic model of mask process variability of a photolithography process, such as for semiconductor manufacturing. In one embodiment, a stochastic error model may be based on a probability distribution of mask process error. The stochastic error model may generate a plurality of mask layouts having stochastic errors, such as random and non-uniform variations of contacts. In other embodiments, the stochastic model may be applied to critical dimension uniformity (CDU) optimization or design rule (DR) sophistication.

20 Claims, 8 Drawing Sheets

US 8,745,545 B2

SYSTEMS AND METHODS FOR STOCHASTIC MODELS OF MASK PROCESS VARIABILITY

CROSS-REFERENCE TO RELATED APPLICATION

This application is a divisional of U.S. patent application Ser. No. 13/098,150 which was filed on Apr. 29, 2011.

BACKGROUND

1. Field of Invention

Embodiments of the invention relate generally to semiconductor manufacturing and, more specifically, in certain embodiments, to the simulation and error modeling of such manufacturing processes.

2. Description of Related Art

Electronic devices are generally employed in numerous configurations to provide a variety of functions. Processing speeds, system flexibility, and size constraints are typically considered by design engineers tasked with developing electronic devices such as computer systems and system components. Such electronic devices generally include memory devices which may be used to store programs and data and which may be accessible to other system components such as processors or peripheral devices. Such memory devices may include volatile and non-volatile memory devices.

The manufacture (also referred to as "fabrication") of semiconductor devices, such as the above-described memory devices, may involve a number of processes and steps. For example, such processes may include photolithography, chemical vapor deposition, physical vapor deposition, dry and wet etching, planarization, etc. In designing a manufacturing process for a semiconductor device, it may be desirable to simulate some of these process and steps, such as by using a computer model. In particular, a photolithography process may be simulated to model the results of a mask used during the process. However, such simulations and the models used therein may not account for all of the mask errors or other errors introduced during the photolithography process.

DETAILED DESCRIPTION

As discussed in further detail below, embodiments of the present invention include stochastic modeling of variable mask process errors of a photolithography process. In some embodiments, a simulation of a photolithography process may include application of stochastic error models generated from a probability distribution, such as a probability distribution of mask process errors. The stochastic error models may produce a plurality of mask layouts for use in analysis and configuration of the photolithography process. In some embodiments, the stochastic error modeling may be applied to critical dimension uniformity (CDU) optimization or design rule (DR) sophistication.

Figure 1:
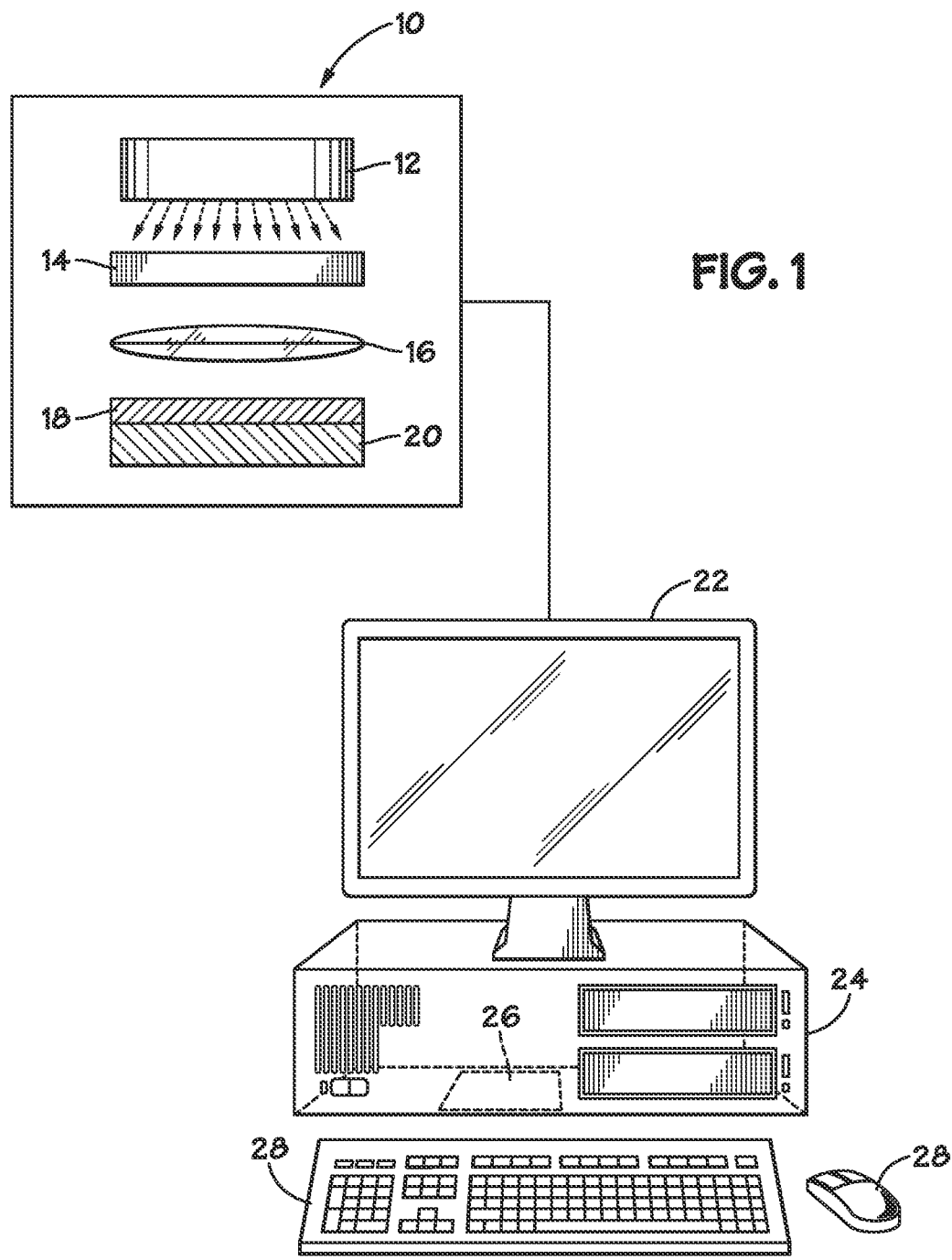
FIG. 1 is a schematic diagram of a photolithography system in accordance with an embodiment of the present invention.

With the foregoing in mind, FIG. 1 is a simplified diagram of a photolithography system 10 in accordance with an embodiment of the present invention. The system 10 includes an illumination source 12 for producing light, a reticle 14, and a lens 16. The photolithography system 10 may use the illumination source 12 and the reticle 14 to pattern a photoresist 18 on a substrate 20 (e.g., a semiconductor wafer). The photolithography system 10 may be coupled to or may include a computer 22, such as for controlling and or monitoring the photolithography system 10. The computer 22 may include a display 24, a processor 26, input devices 28, and volatile memory and non-volatile memory (not shown).

The illumination source 12 of the system 10 may be any suitable illumination source, such as a mirror, lamp, laser, light filter, and/or lens system. The reticle 14 may include a pattern to be projected onto the photoresist 18. The lens 16 may include one or more lenses and/or mirrors that focus the image from the reticle 14 onto the photoresist 18, developing the desired pattern. The photoresist 18 and substrate 10 may then be subsequently processed, such as by etching the photoresist 18 and substrate 20 to form structures based on the pattern developed from the reticle 14.

The computer 22 may be used to design the pattern used by the reticle 14 and provide the appropriate configuration to the photolithography system 10, such as by entering data with the input device 28. A user may use the display 24 to display and review the configuration of the photolithography system 10, such as to review the pattern used by the reticle 14 and the resulting formation of the mask 18.

Figure 2:
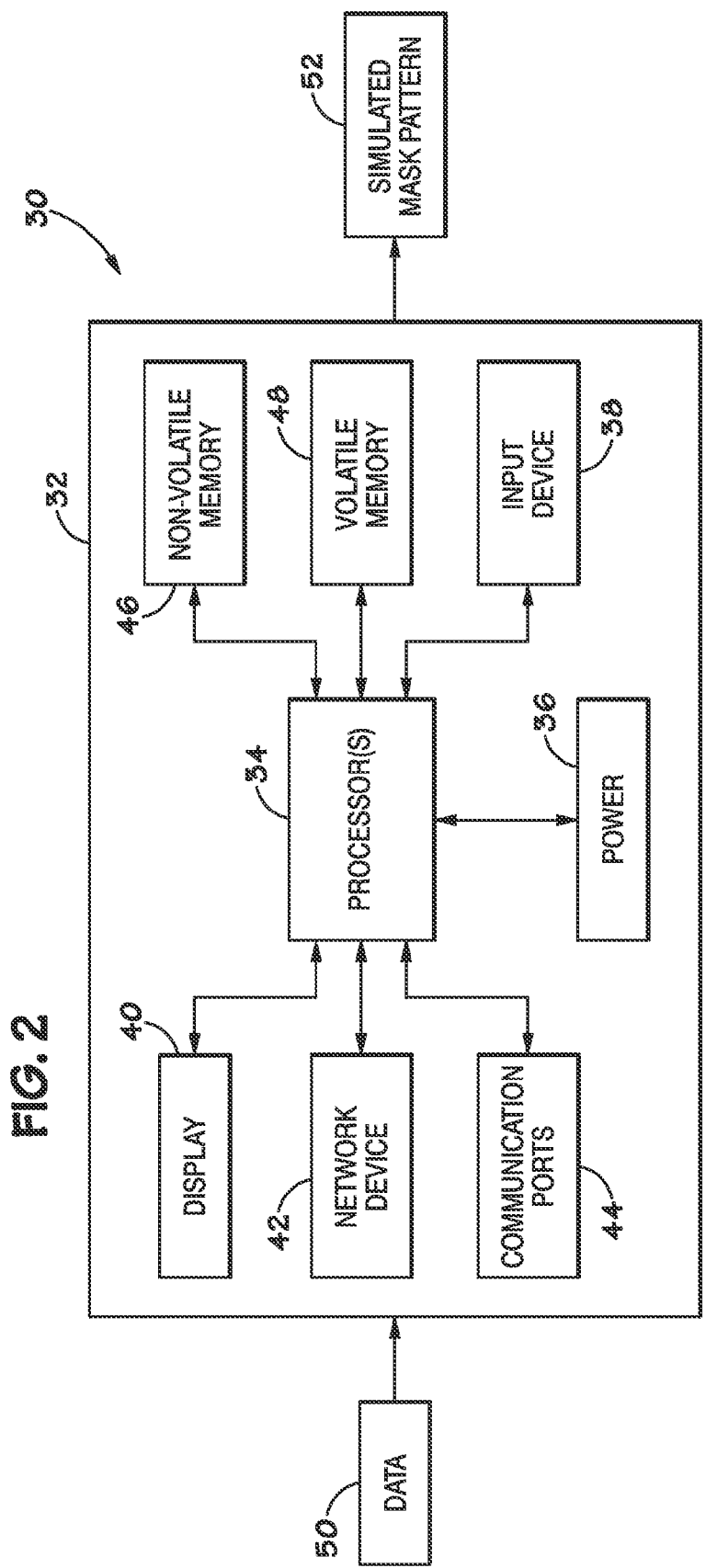
FIG. 2 is a block diagram of a simulation system in accordance with an embodiment of the present invention.

In some embodiments, aspects of the photolithography system 10 may be simulated using a computer. For example, mask patterns (patterns formed by the reticle) and other aspects of the system 10 may be simulated during the design phase of semiconductor devices, before such aspects are implemented in a production environment. FIG. 2 depicts a simulation system 30 in accordance with an embodiment of the present invention. The simulation system 30 may include computer 32 having one or more processors 34 that control the processing of system functions and requests and that execute simulations of the system 30. The computer 32 may include a number of components that include, for example, a power source 36, an input device 38, a display 40, network device 42, communication ports 44, volatile memory 46, and a non-volatile memory 48.

The power supply 36 of the computer 32 may include an AC adapter, so the computer 32 may be connected to an AC power system, such as through a wall outlet. The power supply 36 may also include a DC adapter, permanent batteries, replaceable batteries, and/or rechargeable batteries. The input device 40 may be coupled to the processor 34 and may include buttons, switches, a keyboard, a light pen, a mouse, and/or a voice recognition system, for instance. The display 40 may also be coupled to the processor 34. The display 40 may include an LCD display, a CRT, LEDs, and/or an audio display, for example. Furthermore, the computer 32 may include the network device 42 for communicating over a network, such as a wired or wireless Ethernet network. One or more communication ports 44 may also be coupled to the processor 34. The communication ports 44 may be adapted to be coupled to one or more peripheral devices such as a modem, a printer, a computer, or to a network, such as a local area network, remote area network, intranet, or the Internet, for instance.

The processor 34 generally controls the computer 32 by implementing software programs stored in the volatile memory 46 and non-volatile memory 48. These memories 46 and 48 are operably coupled to the processor 34 to store and facilitate execution of various programs. For instance, the processor 34 may be coupled to the volatile memory 46 which may include Dynamic Random Access Memory (DRAM) and/or Static Random Access Memory (SRAM). As mentioned above, the processor 34 may also be coupled to the non-volatile memory 48. The non-volatile memory 48 may include a read-only memory (ROM), such as an EPROM, and/or flash memory to be used in conjunction with the volatile memory 46. Additionally, the non-volatile memory 48 may include magnetic storage such as tape drives, hard disk drives, and the like.

The simulation system 30 may include input data 50 received and used by the computer 32. For example, as described below, for application of a stochastic model for the mask pattern, the input data 50 may include probability distributions of mask errors for a given photolithography process. The computer 32 may execute a simulation of a photolithography process, such as the photolithography system 10, to simulate the patterning and developing of the photoresist 18 through the reticle 14. In accordance with the embodiments described herein, the simulation may include stochastic models of mask process errors to simulate random and non-uniform variability of the mask process during patterning and developing of the photoresist 18. Based on these models, the computer 32 may output a simulated mask pattern 52 that depicts how a particular pattern and reticle may affect the photolithography process 10. Subsequently, the simulated results 52 may be used during configuration of the photolithography system 10. In some embodiments, the computer 32 may execute distributive engines to implement a simulation, such as Proteus, manufactured by Synopses of Mountainview, Calif., or Calibre, manufactured by Mentor Graphics of Wilsonville, Oreg.

Figure 5:
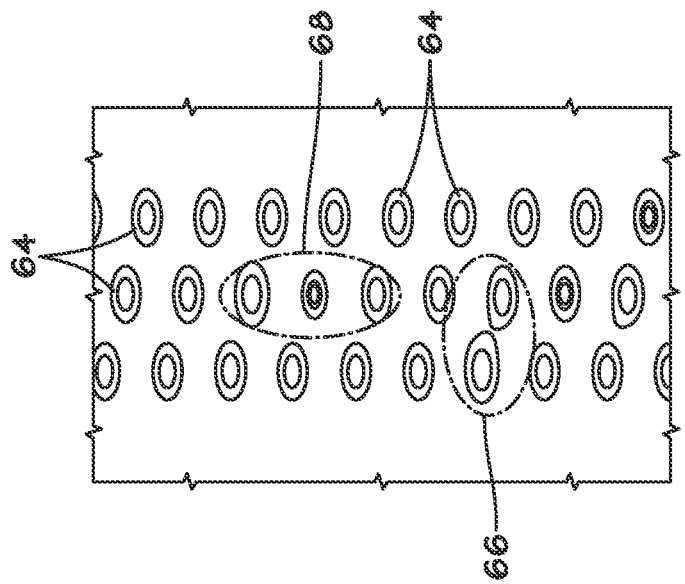
FIGS. 3-5 depict contacts modeled from a mask process in accordance with an embodiment of the present invention.
Figure 4:
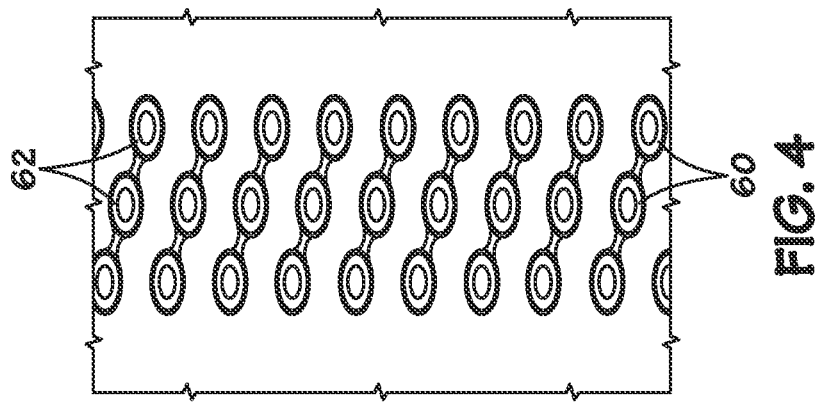
Figure 3:
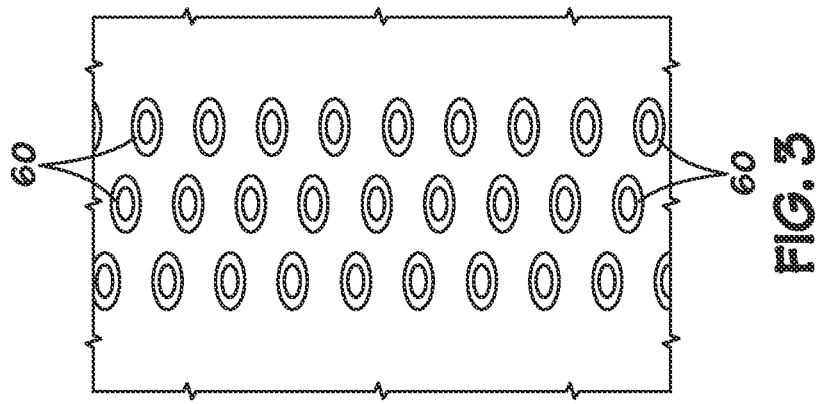

In certain embodiments, the photolithography system 10 may be used to create various features, such as contacts on the substrate 20, by using the reticle 14 to form a mask pattern on a semiconductor wafer or a die. During design of a semiconductor device, the creation of these features may be simulated by the simulation system 30. However, conventional simulations using deterministic error models may not accurately model mask errors due to random and non-uniformity variations in cross-die and cross-field patterns. Mask errors may be introduced through a number of different aspects during fabrication of the reticle 14, which may be either magnified or reduced through the parametric change or fluctuation within the photolithography system 10. Such mask errors may include "stochastic edge fluctuations," e.g., fluctuations in the edges of the contacts, resulting in missing and bridging contacts. FIGS. 3, 4, and 5 described below contrast the simulation of a mask process through conventional models as compared to the stochastic errors, e.g., stochastic edge fluctuations, present in the contacts.

FIG. 3 depicts a portion of contact 60 modeled using layout generated by optical proximity correction (OPC) without any mask error. As shown in FIG. 3, there are no variable or non-uniform mask errors, such as edge fluctuations, depicted in the contacts 60, as each contact is relatively uniform. FIG. 4 depicts contacts 62 modeled using layout generated by OPC with deterministic mask error applied. Here again, as shown in FIG. 4, the mask contours are uniform and non-variable, and do not depict any non-uniformity from randomized mask errors. Finally, FIG. 5 depicts contacts 64 modeled using stochastic error modeling. As shown in FIG. 5, the contacts 64 are non-uniform and have random variations. For example, such variations (i.e., stochastic errors) may include bridging contacts 66 and malformed contacts 68. FIG. 5 shows that the stochastic error model is capable of modeling inter-contact variation, which better reflects what is generally seen on wafer and is beyond the capability of conventional deterministic models.

Figure 6:
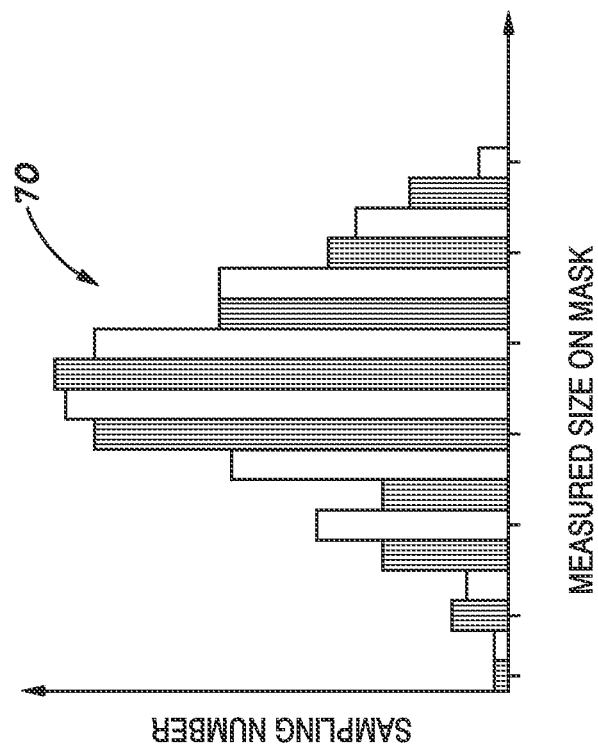
FIG. 6 depicts a probability distribution of a mask process for bitline contact formation in accordance with an embodiment of the present invention.
Figure 8:
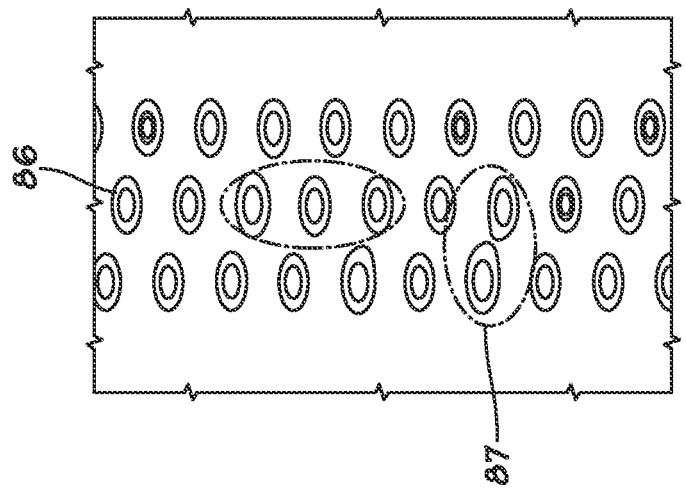

FIGS. 6 and 8 depict aspects of stochastic error modeling of mask process variability in accordance with embodiments of the present invention. As described below, the stochastic error model may model stochastic fluctuations based on a probability distribution, such as the probability distribution of mask error for a mask process. For example, FIG. 6 depicts a probability distribution 70 of mask error for bitline contact formation for a NAND memory device. The probability distribution 70 may illustrate a particular dimension or characteristic of the bitline contacts. Using such probability data, multiple mask layouts may be modeled to simulate the stochastic errors of mask process variability.

Figure 7:
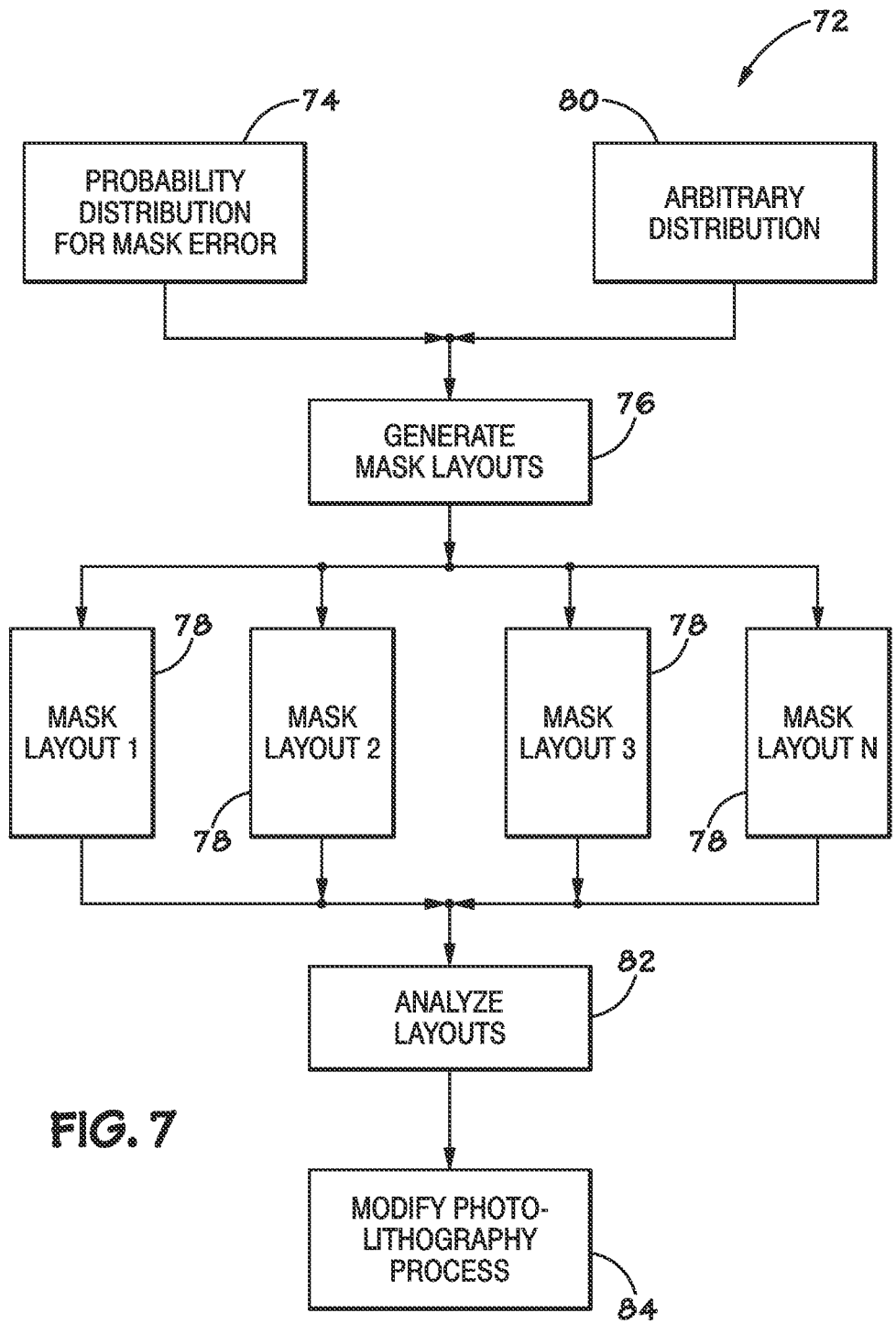
FIG. 7 is a block diagram of a process for executing a stochastic model for a mask process in accordance with an embodiment of the present invention.

FIG. 7 depicts a process 72 for executing a stochastic model that simulates the random and non-uniform mask process variability. Some or all of the steps of the process 72 may be implemented as coded instructions stored on a non-transitory tangible machine-readable medium, such as the volatile memory 48 or the non-volatile memory 46. Initially, a probability distribution for a desired mask process may be obtained (block 74) such as from the photolithography system 10 described above. Next, the probability distribution may be used to generate (block 76) a number of mask layouts 78 (e.g., mask layouts 1, 2, 3 . . . n). As described further, below, in some embodiments the stochastic models may be based on other layouts, such as an OPC layout. In such an embodiment, the layout input to the stochastic modeling process may be referred to as a "post-OPC" layout. Each of the layouts 78 may model various stochastic errors in the mask process, such as the stochastic fluctuations in the edges of features, e.g., contacts, of the mask pattern. In other embodiments, an arbitrary distribution (block 80) may be used as an input for the mask generation of the stochastic models. The layouts 78 may be analyzed to determine if the mask process variability is within acceptable limits or ranges (block 82). Based on this determination, the mask pattern, reticle fabrication, illumination, and other parameters of the photolithography process 10 may be modified (block 84) to achieve acceptable mask process variability.

Figure 10:
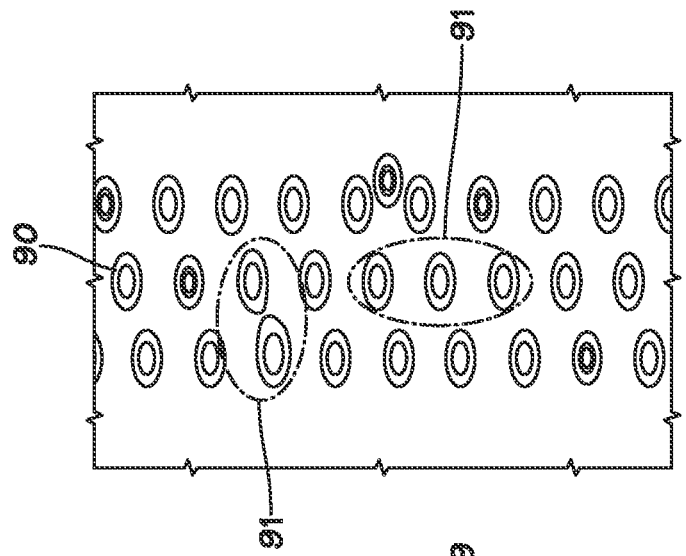
FIGS. 8, 9, and 10 depict mask layouts generated from the stochastic model of FIG. 7 in accordance with an embodiment of the present invention.
Figure 9:
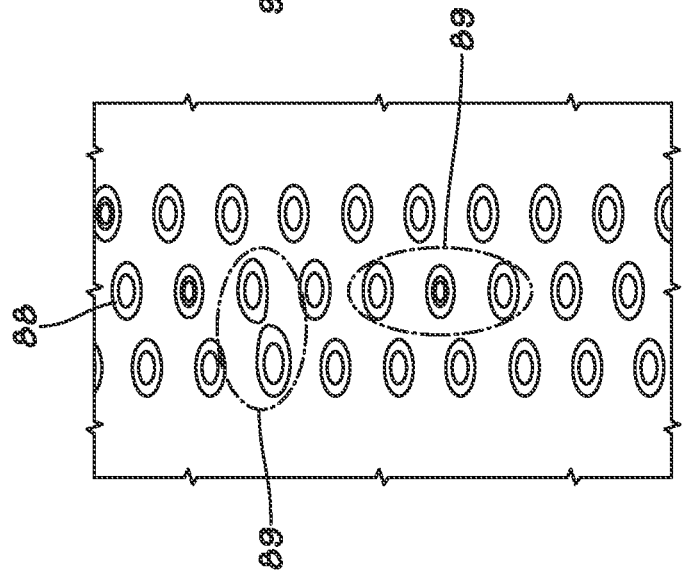

FIGS. 8, 9, and 10 depict examples of mask layouts generated from the stochastic error modeling described above, in accordance with embodiments of the present invention. With reference to the bitline contacts described above in FIGS. 3-5, each of the layouts depicted in FIGS. 8, 9, and 10 depict stochastic errors based on a probability distribution of mask errors of a photolithography process for formation of these bitline contacts. For example, as shown in FIG. 8, a mask layout 86 may include stochastic errors 87, such as bridging contacts. Additionally, as shown in FIG. 9, a second mask layout 88 may include stochastic errors 89, such as bridging contacts and malformed contacts. Finally, as shown in FIG. 10, a third mask layout 90 may include stochastic errors 91, such as bridging contacts. Thus, each mask layout 86, 88, and 90 generated from the stochastic models may include different non-deterministic mask errors, providing simulation of random and non-uniform variations in the mask process. Any number of stochastic models, such as the mask layouts, may be generated, and the number of models may be based on the probability distribution input to the stochastic modeling process 70.

The stochastic model of mask process variability described above may be implemented in various applications in semiconductor device manufacturing. For example, as described further below, such applications may include critical dimension uniformity (CDU) optimization and design rule (DR) sophistication.

Figure 11:
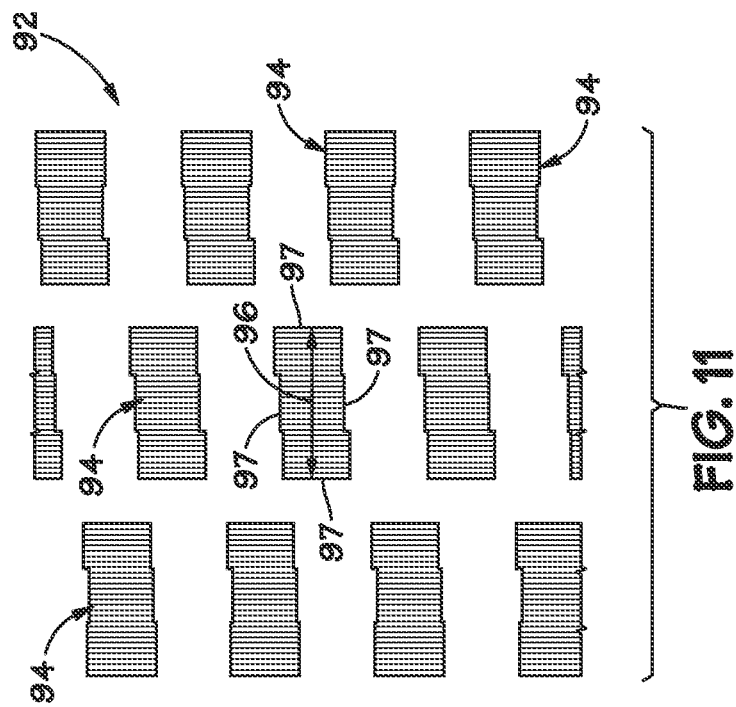
FIG. 11 depicts a critical dimension for bitline contacts in accordance with an embodiment of the present invention.

FIG. 11 depicts an example of a critical dimension (CD) for bitline contacts of a NAND device in accordance with an embodiment of the present invention. FIG. 11 depicts a post-OPC layout 92 of bitline contact polygons 94 having a width 96 and edges 97. The width 96 may be a CD target for the reticle 14 and mask process. For application of the stochastic model described above, the probability distribution of the width 90 may be converted to a probability distribution for the placement of the edges 97. This edge placement probability distribution may be provided as input data to the stochastic model, resulting in the modeling of stochastic fluctuations of the edges 97 of the polygons 94.

Figure 12:
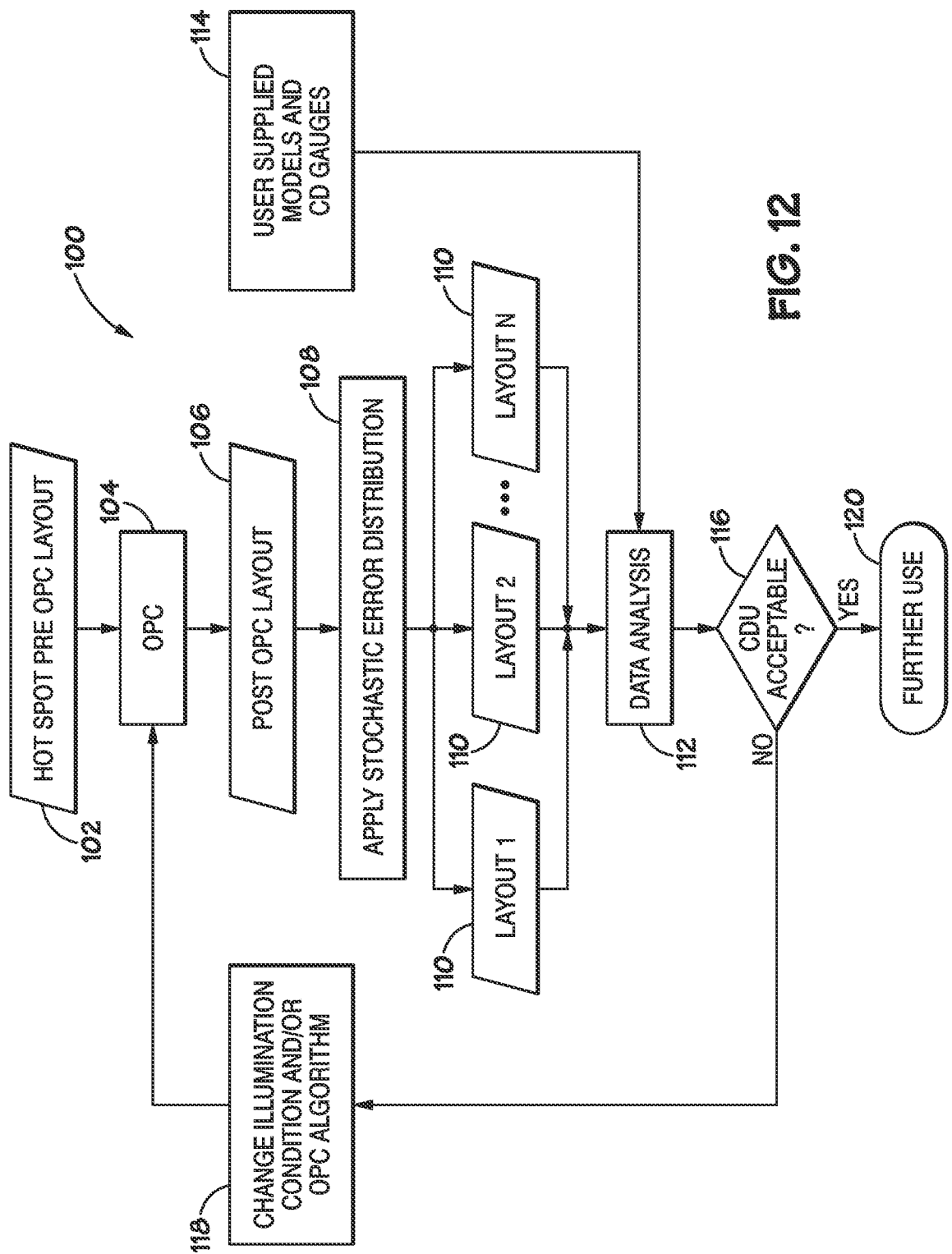
FIG. 12 is a block diagram of a process for application of a stochastic model to critical dimension uniformity in accordance with an embodiment of the present invention.

FIG. 12 depicts a process 100 for application of the above-described stochastic model to CDU optimization in accordance with an embodiment of the present invention. Some or all of the steps of the process 100 may be implemented as coded instructions stored on a non-transitory tangible machine-readable medium, such as the volatile memory 48 or the non-volatile memory 46 of the computer 32. Initially, the array's pre-OPC layout may be determined (block 102). Next, OPC may be applied to the pre-OPC layout (block 104) to produce a post-OPC layout (block 106). After the post-OPC layout is produced, the stochastic error distributions may be applied to the post-OPC layout (block 108). As described above, the stochastic error distributions may be based on previously determined probability distributions from a mask process or arbitrary distributions.

Application of the stochastic error distributions may produce multiple layouts 110. For example, in the case of CDU optimization for bitline contacts, each of the layouts 110 may depict a layout of bitline contacts having stochastic errors, i.e., different random and non-uniform variations in the contacts. The number of layouts produced may be based on the stochastic error distribution applied to the post-OPC layout and the desired accuracy of the stochastic modeling. Next, the stochastic model layouts may be analyzed for CDU (block 112). For example, models and CD gauges (block 114) be used to determine if the CDU meets a desired criteria. After the analysis, the desired CDU may be verified as acceptable or not acceptable (decision block 116). If the CDU is not acceptable, the parameters of the simulation may be changed, such as illumination condition, mask pattern, OPC algorithm, etc (block 118). After changing parameters, the OPC (block 104) and the stochastic error distributions (block 108) may be reapplied. If the desired CDU is acceptable (decision block 116), the parameters may be used in subsequent simulations or implemented in fabrication (block 118).

Figure 13:
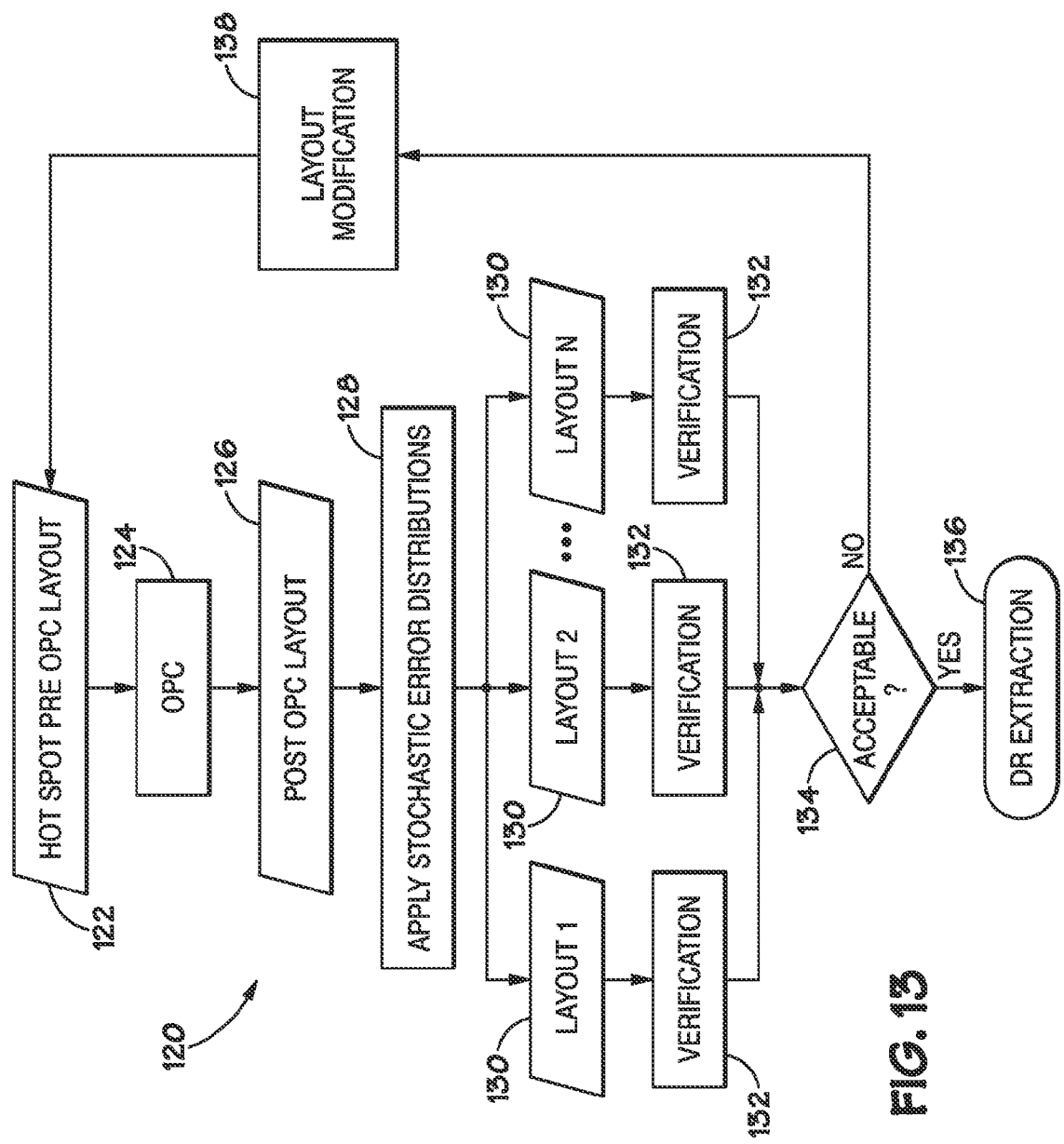
FIG. 13 is a block diagram of a process for application of a stochastic model to design rule sophistication in accordance with an embodiment of the present invention.

In other embodiments, as mentioned above, the stochastic error modeling may be applied to design rule (DR) techniques. FIG. 13 depicts a process 120 for application of the above-described stochastic error model to DR sophistication in accordance with an embodiment of the present invention. Some or all of the steps of the process 120 may be implemented as coded instructions stored on a non-transitory tangible machine-readable medium, such as the volatile memory 48 or the non-volatile memory 46 of the computer 32. In an embodiment, a "hot spot" pre-OPC layout may first be determined (block 122). As used herein, the term "hot spot" refers to a weak, broken, or otherwise defective area of a mask pattern on a semiconductor wafer or die. Next, OPC may be applied (block 124) to the pre-OPC layout to produce a post-OPC layout (block 126). After the post-OPC layout is produced, the stochastic error distributions may be applied to the post-OPC layout (block 128) to produce mask layouts 130 (e.g., layouts 1, 2 ... N). As described above, the stochastic error distributions may be input from previously determined probability distributions or arbitrary distributions.

After producing the stochastic model layouts, each layout 130 may be verified (blocks 132) for pattern quality, e.g., to identify errors in the layouts 130. Such errors may include line errors, space violation errors, out-of-tolerance regions, or other errors. The verification may use any metrics of patterning quality, such as CD variation, image contrast, and other inline metric verifications. In one embodiment, the verification may use Silicon vs. Layout (SiVL) verification available from Synopsys of Mountain View, Calif., or another other inline metric verifications. The verifications may be evaluated as acceptable or not acceptable (decision block 134). If the verifications are acceptable, a design rule may be extracted (block 136). If the verifications are not acceptable, the then pre-OPC layouts may be modified (block 138) and the process 120 may be re-executed.

In other embodiments, the stochastic error modeling described above may be implemented in design for manufacturing (DFM) methodology. Further, the stochastic error modeling is not limited to the examples described above but may be applied as an alternative to, or in addition to, any deterministic models of photolithography processes or other fabrication processes.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:
1. A method, comprising:
generating a plurality of stochastic error models, using a processor, from probability data for a distribution of random and non-uniform errors applied to a semiconductor photolithographic mask of a photolithography process;
using the processor to provide an analysis by analyzing the plurality of stochastic error models applied to the semiconductor photolithographic mask based on one or more semiconductor fabrication criteria; and
generating a recommendation for modifying the semiconductor photolithographic mask based on the analysis of the plurality of stochastic error models.

2. The method of claim 1, wherein the probability data comprises a probability distribution of mask error for the photolithography process.

3. The method of claim 1, wherein the criteria comprises a critical dimension.

4. The method of claim 3, wherein using processor comprises using the process to analyze the stochastic error models for critical dimension uniformity (CDU).

5. The method of claim 4, wherein the recommendation for a modified semiconductor mask comprises a modification of an illumination source of the photolithography process.

6. The method of claim 1, wherein generating a plurality of stochastic error models comprises receiving stochastic errors of contacts of a semiconductor device.

7. The method of claim 6, wherein the stochastic errors comprise missing contacts and broken contacts of the semiconductor device.

8. The method of claim 1, wherein using the processor to analyze the plurality of stochastic error models comprises using the processor to verify the stochastic error models for mask errors using a pattern quality metric.

9. A non-transitory tangible machine-readable medium having code stored thereon, the code comprising instructions for:
    generating a plurality of stochastic error models, using a processor, from probability data for a distribution of random and non-uniform errors applied to a semiconductor photolithographic mask of a photolithography process;
    using the processor to provide an analysis by analyzing the plurality of stochastic error models for the semiconductor photolithographic mask based on one or more semiconductor fabrication criteria; and
    generating a recommendation for modifying the semiconductor lithographic mask based on the analysis of the plurality of stochastic error models.

10. The non-transitory tangible machine-readable medium of claim 9, wherein the code comprises instructions for modifying parameters of the photolithography process according to the recommendation.

11. The non-transitory tangible machine-readable medium of claim 10, wherein modifying parameters of the photolithography process comprises modifying the illumination condition of the photolithography process.

12. The non-transitory tangible machine-readable medium of claim 9, wherein the code comprises instructions for modifying the probability distribution of mask error in response to the recommendation.

13. The non-transitory tangible machine-readable medium of claim 9, wherein the stochastic error models comprise missing contacts, broken contacts, or any combination thereof.

14. The non-transitory tangible machine-readable medium of claim 9, wherein the criteria comprises a critical dimension.

15. The non-transitory tangible machine-readable medium of claim 14, wherein the code comprises instructions to analyze the stochastic error models for critical dimension uniformity (CDU).

16. A non-transitory tangible machine-readable medium having code stored thereon, the code comprising instructions for:
    generating a plurality of stochastic error models, using a processor, from probability data for a distribution of random and non-uniform errors applied to a semiconductor photolithographic mask of a photolithography process;
    using the processor to analyze the plurality of stochastic error models for the semiconductor photolithographic mask based on one or more semiconductor fabrication criteria; and
    verifying the plurality of stochastic error mask layouts for mask errors using a deterministic model.

17. The non-transitory tangible machine-readable medium of claim 16, wherein the code comprises instructions for modifying parameters of the photolithographic mask based on the verifying.

18. The non-transitory tangible machine-readable medium of claim 16, wherein the deterministic model comprises a pattern quality metric.

19. The non-transitory tangible machine-readable medium of claim 16, wherein the code comprises instructions for receiving the probability data for the distribution of errors.

20. The non-transitory tangible machine-readable medium of claim 19, wherein verifying the plurality of stochastic error mask layouts comprises identifying line errors, space violation errors, out-of-tolerance regions, or any combination therefore.

* * * * *